(12) United States Patent
Mann et al.

(10) Patent No.: US 9,110,225 B2
(45) Date of Patent: Aug. 18, 2015

(54) ILLUMINATION OPTICS FOR A METROLOGY SYSTEM FOR EXAMINING AN OBJECT USING EUV ILLUMINATION LIGHT AND METROLOGY SYSTEM COMPRISING AN ILLUMINATION OPTICS OF THIS TYPE

(75) Inventors: Hans-Jürgen Mann, Oberkochen (DE); Alois Herkommer, Aalen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 215 days.

(21) Appl. No.: 13/698,552

(22) PCT Filed: Apr. 12, 2011

(86) PCT No.: PCT/EP2011/055679
§ 371 (c)(1),
(2), (4) Date: Nov. 16, 2012

(87) PCT Pub. No.: WO2011/144389
PCT Pub. Date: Nov. 24, 2011

(65) Prior Publication Data
US 2013/0063716 A1   Mar. 14, 2013

Related U.S. Application Data

(60) Provisional application No. 61/345,669, filed on May 18, 2010.

(30) Foreign Application Priority Data

May 18, 2010   (DE) .......................... 10 2010 029 049

(51) Int. Cl.
*G02B 17/06*   (2006.01)
*G02B 5/10*    (2006.01)
(Continued)

(52) U.S. Cl.
CPC ............... *G02B 5/10* (2013.01); *G02B 5/0891* (2013.01); *G02B 17/0626* (2013.01);
(Continued)

(58) Field of Classification Search
CPC .... G02B 5/10; G02B 5/0891; G02B 17/0626; G02B 19/0095; G02B 19/0023; G02B 19/0047; G03F 1/84; G03F 1/24
USPC .............................. 359/351, 364–366; 356/51
See application file for complete search history.

(56) References Cited

U.S. PATENT DOCUMENTS 7,372,624 B2 *  5/2008  Mann et al. .................... 359/365
7,508,580 B2 *  3/2009  Mann et al. .................... 359/365
(Continued)

FOREIGN PATENT DOCUMENTS

DE    102 20 815    11/2003
DE    102 20 816    11/2003
(Continued)

OTHER PUBLICATIONS

International Search Report for corresponding application PCT/EP2011/055679.

(Continued)

*Primary Examiner* — Frank Font
(74) *Attorney, Agent, or Firm* — Fish & Richardson P.C.

(57) ABSTRACT

A metrology system serves to examine an object arranged in an object field using EUV illumination light. An illumination optics of the metrology system has a collector mirror which is arranged in the beam path directly downstream of an EUV light source. Downstream of the collector mirror, less than three additional illumination mirrors are arranged in the beam path between the collector mirror and the object field. An intermediate focus is arranged in the beam path between the collector mirror and the additional illumination mirror. The metrology system further includes a magnifying imaging optics for imaging the object field into an image field in an image plane. As a result a metrology system is obtained which comprises an illumination optics that ensures an efficient illumination of the object field by means of illumination parameters which are well adapted to the illumination situation of current EUV projection exposure apparatuses.

21 Claims, 3 Drawing Sheets

(51) Int. Cl.
  *G02B 5/08* (2006.01)
  *G03F 1/84* (2012.01)
  *G02B 19/00* (2006.01)
  *G03F 1/24* (2012.01)

(52) U.S. Cl.
  CPC ....... *G02B 19/0023* (2013.01); *G02B 19/0047* (2013.01); *G02B 19/0095* (2013.01); *G03F 1/84* (2013.01); *G03F 1/24* (2013.01)

(56) References Cited

U.S. PATENT DOCUMENTS

| | | | |
|---|---|---|---|
| 7,583,433 B2* | 9/2009 | Antoni et al. | 359/351 |
| 2004/0140440 A1 | 7/2004 | Schultz et al. | |
| 2005/0088760 A1 | 4/2005 | Mann et al. | |
| 2005/0207039 A1* | 9/2005 | Singer et al. | 359/858 |
| 2006/0024589 A1 | 2/2006 | Schwarzl et al. | |
| 2008/0170310 A1 | 7/2008 | Mann | |
| 2008/0225387 A1* | 9/2008 | Hainz et al. | 359/351 |
| 2008/0266650 A1 | 10/2008 | Sasian | |

FOREIGN PATENT DOCUMENTS

| | | |
|---|---|---|
| DE | 10 2005 003 557 | 8/2006 |
| DE | 10 2008 009 600 | 8/2009 |
| EP | 1 220 039 | 7/2002 |
| WO | WO 03/075068 | 9/2003 |
| WO | WO 03/096356 | 11/2003 |

OTHER PUBLICATIONS

Barty, A. et al. "Aerial Image Microscopes for the Review of Defects in EUVL Masks", Dallas, TX, Oct. 2002, 19 pages.

* cited by examiner

ILLUMINATION OPTICS FOR A METROLOGY SYSTEM FOR EXAMINING AN OBJECT USING EUV ILLUMINATION LIGHT AND METROLOGY SYSTEM COMPRISING AN ILLUMINATION OPTICS OF THIS TYPE

CROSS-REFERENCE TO RELATED APPLICATIONS

This application is a national stage application of PCT/EP2011/055679, filed on Apr. 12, 2011, which claims priority to U.S. Provisional Application 61/345,669 and German Application 10 2010 029 049.1, both filed on May 18, 2010, herein incorporated by reference in their entirety.

TECHNICAL FIELD

The invention relates to an illumination optics for a metrology system for examining an object arranged in the object field using EUV illumination light. Furthermore, the invention relates to a metrology system for examining an object arranged in the object field using EUV illumination light, the metrology system comprising an illumination optics of this type.

BACKGROUND

WO 03/096356 A2 describes a reflective X-ray microscope and inspection system for examining objects using wavelengths of no more than 100 nm. WO 03/075068 A1 describes an illumination system comprising a nested collector for annular illumination of an exit pupil. An illumination optics for a metrology system for examining an object arranged in an object field using EUV illumination light is described in the scientific article "Aerial Image Microscopes for the Review of Defects in EUVL Masks" by A. Barty et al., ISMT EUVL Symposium, Dallas, Tex., October 2002.

SUMMARY

It is an object of the present invention to develop an illumination optics of the type named at the outset and a metrology system equipped therewith in such a way as to achieve an efficient illumination of the object field using illumination parameters which are well adapted to the illumination situation of current EUV projection exposure apparatuses.

This object is achieved according to the invention by an illumination optics having the features set out in claim 1.

An illumination optics comprising less than three additional mirrors arranged downstream of the collector mirror results in low reflection losses between the EUV light source and the object field. The intermediate focus between the collector mirror and the first additional mirror allows the collector mirror to be, to a large extent, mechanically separated from the downstream optical elements. This prevents a contamination of these downstream elements by material which is emitted by the EUV light source and carried over in an unwanted manner. The collector mirror may be an NI mirror. An NI mirror is a mirror where a main beam angle of incidence relative to a normal to the mirror surface is smaller than 30°. This results in an illumination optics which has a relatively simple design. The collector mirror can be an aspheric mirror, in particular in the manner of a purely conical asphere. As a result, the collector mirror has a collecting effect which is well adapted to the emission properties of current EUV light sources.

Exactly two additional illumination mirrors according to claim 2 form an advantageous compromise between a guidance of illumination light where losses are kept to a minimum and an object illumination which corresponds to predefined illumination parameters as exactly as possible.

Designing the additional mirrors as NI mirrors according to claim 3 minimizes reflection losses at these additional mirrors.

An illumination chief ray angle according to claim 4 is well adapted to the relationships occurring during EUV projection exposure. The illumination chief ray angle is the angle between chief rays of the EUV rays which are reflected by the object on the one hand and a normal to the object plane on the other. The illumination chief ray angle may also amount to 8°. The illumination optics may be designed for several chief ray angles and is then provided with a movable setting stop to change between these chief ray angles.

A numerical aperture on the object side according to claim 5 is well adapted to the imaging relationships of projection objectives in projection exposure apparatuses for EUV microlithography for the production of microstructured or nanostructured components. The numerical aperture on the object side may amount to at least 0.0825 and may in particular amount to at least 0.125. The illumination optics may be provided with a setting stop which allows one to change between these numerical apertures.

A setting stop according to claim 6 can be arranged at a position of the illumination light beam path which is passed through by the EUV illumination light exactly once. This prevents vignetting of the illumination light.

Arranging the bundle-guiding component according to claim 7 is also known as critical illumination of the object field. With this type of illumination, the light source is imaged into the object field.

Concerning the metrology system, the object named at the outset is achieved by a metrology system having the features set out in claim 8. The metrology system may comprise a detection device arranged in the object field, for instance in the form of a CCD chip of a CCD camera.

The advantages of a metrology system according to claim 8 correspond to those which have already explained above with reference to the illumination optics according to the invention.

The magnifying imaging optics of the metrology system is an optical assembly which forms an essential individual aspect of the invention even without the additional components of the metrology system.

Due to the low number of reflections, a four-mirror system according to claim 9 ensures a good throughput of the imaging optics even if reflection losses at the mirrors are inevitable.

At least one of the imaging mirrors may be an asphere. In particular the imaging mirror which is the first mirror downstream of the object field may be an aspheric mirror. The imaging mirrors may all have continuous reflection surfaces, in other words they have no through-opening for the imaging light. The imaging optics may be provided with its own aperture stop for adjusting a numerical aperture of the imaging optics on the object side and/or for adjusting an imaging chief ray angle on the object side. This aperture stop may be closer to the project plane than any of the mirrors of the imaging optics.

The illumination mirrors and/or the imaging mirrors may be provided with a highly reflective coating which optimizes the degree of reflection of the EUV illumination light or imaging light. The highly reflective coating may be a multi-layer coating which is generally known from prior art.

The object field of the metrology system may have a field size of at least 5 μm×5 μm, of at least 7.5 μm×7.5 μm, of at least 10 μm×10 μm, of at least 15 μm×15 μm. The field size may for example be 20 μm×20 μm. The image field may be arranged at a distance relative to a normal through a center of the object field, in other words it may be decentered (off-axis). A centered arrangement where this normal, which penetrates the center of the object field, also passes through the center of the image field is conceivable as well.

BRIEF DESCRIPTION OF DRAWINGS

An exemplary embodiment of the invention will hereinafter be explained in more detail by means of the drawing in which.

DETAILED DESCRIPTION

Figure 1:
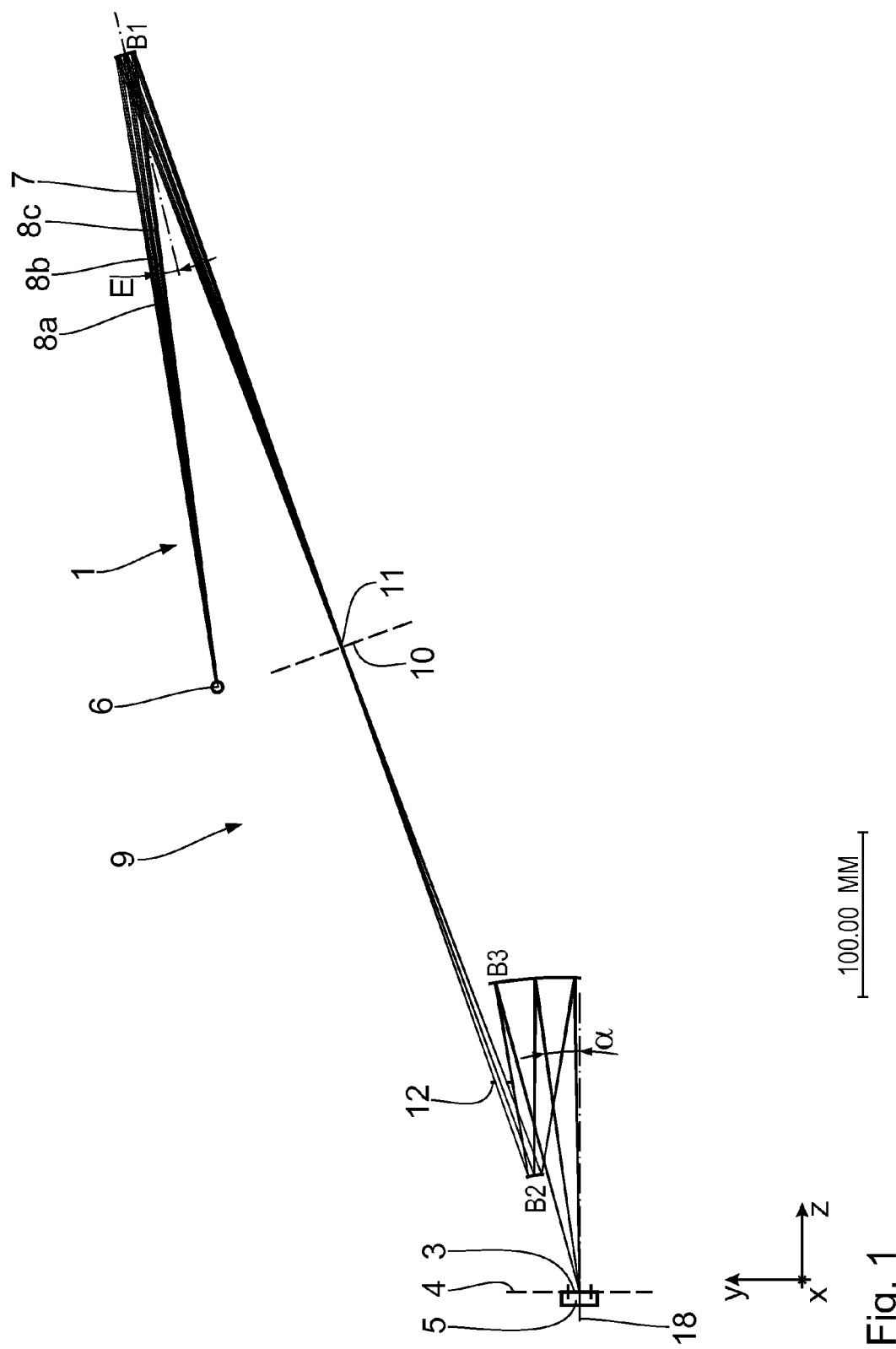
FIG. 1 shows a meridional section through an illumination optics for a metrology system for examining an object arranged in the object field using EUV illumination light.

A Cartesian xyz-coordinate system will hereinafter be used to facilitate the description of positional relationships. In the Figures, the x-axis runs into the drawing plane in a direction perpendicular thereto. The y-axis runs upwards in the Figures. The z-axis runs to the right in the Figures.

Figure 2:
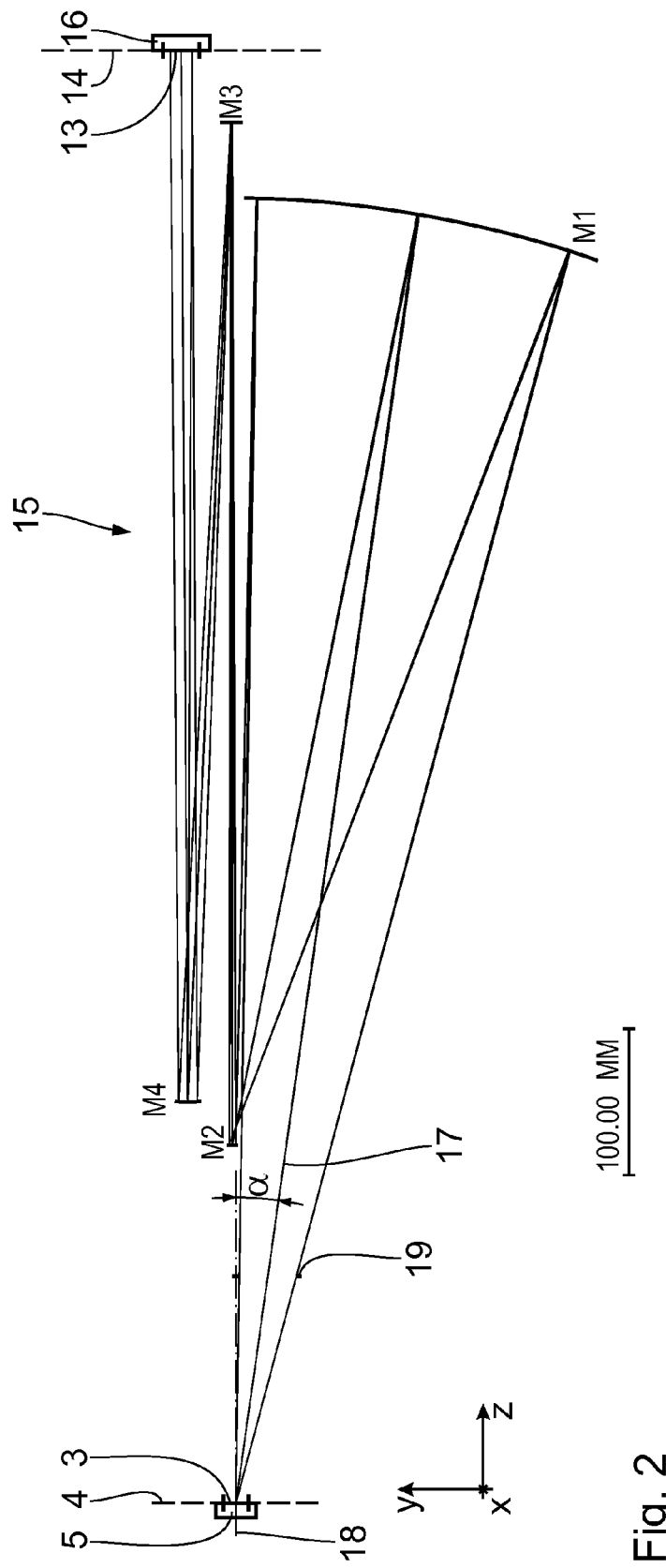
FIG. 2 shows a meridional section of a magnifying imaging optics of the metrology system for imaging the object field in an object plane into an image field in an image plane.
Figure 3:
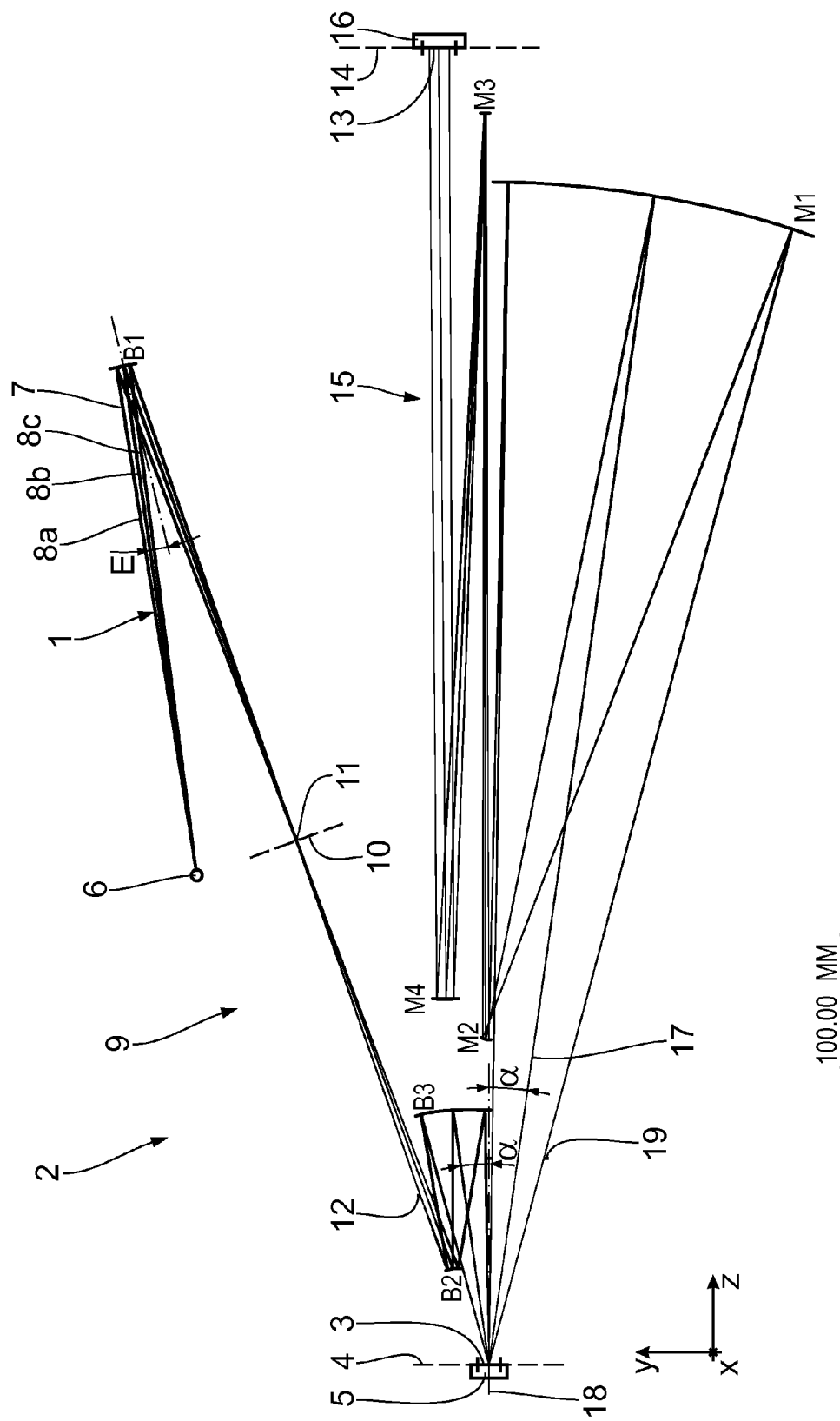
FIG. 3 shows another meridional section through the entire EUV beam path of the illumination optics and the magnifying imaging optics of the metrology system.

FIG. 3 shows a meridional section through a beam path of EUV illumination light or imaging light 1 in a metrology system 2 for examining an object 5 arranged in an object field 3 in an object plane 4 by means of the EUV illumination light 1. The metrology system 2 serves to analyze a so-called aerial image (aerial image metrology system, AIMS) with the aim of simulating and analyzing the effects of properties of lighographic masks, so-called reticles which are in turn used for projection exposure when producing semiconductor components, on the optical imaging of projection optical systems in a projection exposure apparatus. AIMS systems are known from DE 102 20 815 A1 (cf. FIG. 9) and DE 102 20 816 A1 (cf. FIG. 2).

The EUV illumination light 1 is generated by an EUV light source 6. The light source 6 may be a laser plasma source (LPP; laser produced plasma) or a discharge source (DPP; discharge produced plasma).

The drawing shows the path of individual EUV rays which are emitted by the light source 6. The drawing shows three ray groups 8a, 8b, 8c which are emitted by the light source 6 and comprise in each case three individual EUV rays 7. Each of the ray groups 8a, 8b, 8c represents a different illumination direction from which the object 5 is illuminated. The outer ray groups 8a, 8c are near-edge illumination angles and are also referred to as coma rays. The central ray group 8b represents the chief rays of the illumination.

A collector mirror B1, which is arranged in the beam path directly down-stream of the EUV light source 6, is reflected by the illumination light 1 at an angle of incidence E which is smaller than 30°. The collector mirror B1 is a reflection mirror close to vertical incidence which is also referred to as normal incidence (NI) mirror.

The collector mirror B1 is part of an illumination optics 9, which is also shown in FIG. 2, for illuminating the object field 3 with the illumination light 1. The illumination optics 9 is designed for critical illumination of the object field 3. The light source 6 is thus imaged into the object field 3.

Along with the collector mirror B1, the illumination optics 9 also includes two additional mirrors B2, B3 which are numbered in the order in which they are arranged in the illumination beam path of the illumination light 1. The illumination optics 9 has therefore less than three additional mirrors B2, B3 which are arranged downstream of the collector mirror B1 in the beam path of the imaging light 1 between the collector mirror B1 and the object field 3. The two additional illumination mirrors B2, B3 are NI mirrors as well, in other words the illumination light is reflected at a chief ray angle of incidence E which is smaller than 30°.

The illumination mirror B1 is concave. The illumination mirror B2 is convex. The illumination mirror B3 is concave.

An intermediate focus 11 is arranged in an intermediate focal plane 10 in the beam path of the illumination light 1 between the collector mirror B1 and the first additional mirror B2. In order to separate optical components near the source from the downstream optical components at this point, the illumination light 1 may be guided through an opening whose aperture is adapted to the diameter of the intermediate focus 11.

In the beam path between the intermediate focus 11 and the illumination mirror B2, a setting stop 12 is arranged for defining a maximum illumination angle for object illumination. The setting stop 12 is arranged at a position in the beam path of the illumination light 1 which is penetrated by the illumination light 1 exactly once. Depending on the opening width of the setting stop 12, it is possible to define a numerical aperture of the illumination optics 9 on the object side. This numerical aperture on the object side is continuously adjustable in a range between near 0 and 0.125 and in particular in a range between 0.0625 and 0.125.

Having been reflected by the last illumination mirror B3, the illumination light has an illumination chief ray angle of incidence $\alpha$ of 8° when it is guided to the object field 3 for object illumination. The object 5 reflects the illumination light 1, which also serves as imaging light for imaging the object field 3, into an image field 13 in an image plane 14. This imaging process takes place using an imaging optics 15 in the form of a catoptric projection objective which is also shown in FIG. 2. The imaging optics 15 images the object field 3 into the image field 13 at a magnification factor (imaging scale $\beta$) of 750. For analyzing the generated magnified image, a CCD chip is arranged in the image field 13 which is part of a CCD camera 16 which is diagrammatically shown in FIG. 3 and serves as a detection device of the metrology system 2.

The object field 3 on the one hand and the image field 13 on the other are disposed in xy-planes which are spaced from each other.

In the imaging beam path of the imaging light 1 between the object field 3 and the image field 13, chief rays 17, in other words the EUV rays 7 of the illumination ray group 8b reflected by the object 5, run from the object field 3 to a central object field point of the object plane 4 at a chief ray angle of reflection $\alpha$ of 8° relative to a normal 18 running in the z-direction.

A numerical aperture of the imaging optics 1 near the object field is NAO=0.125. The numerical aperture near the object field can be reduced to NAO=0.026 or NAO=0.0825 by means of a decenterable aperture stop 19, which allows a chief ray angle $\alpha$ of 6° to be achieved at the same time as well.

In the image plane 14, the imaging rays of the imaging light 1 hit the image field 13 virtually perpendicular to the image plane 14 and virtually parallel to each other.

In the imaging beam path of the imaging light 1 between the object field 3 and the image field 13, the imaging optics 15 has exactly four mirrors which are referred to by M1 to M4 in the order in which they are arranged in the imaging beam path. The first mirror M1 in the beam path down-stream of the object field 3 is concave and aspheric. The following mirror M2 is concave as well. The following mirror M3 is convex. The following mirror M4 is concave.

The drawing shows the section curves of parent surfaces which are used for mathematical modeling of the reflection surfaces of the mirrors B1 to B3 and M1 to M4. The regions of the reflection surfaces which are actually physically present in the illustrated section curve (meridional section) are those regions of the mirrors B1 to B3 and M1 to M4 which are actually impinged by the EUV illumination or imaging light 1.

The illumination mirror B2 and the imaging mirrors M2 to M4 are spherical mirrors. The mirror B3 is a toric mirror which has different radii of curvature in principal planes which are perpendicular to each other. In the mirror B3, a spherical section is in each case obtained in these principal planes.

The illumination mirror B1 is a purely conical asphere.

The illumination optics 9 and the imaging optics 15 are designed for an operating wavelength of 13.5 nm.

The mirrors M1 to M4 of the imaging optics 15 are all provided with continuous reflection surfaces, in other words they have no through-opening for the imaging light 1.

The aperture stop 19 is arranged closer to the object plane 4 than any of the mirrors M1 to M4 of the imaging optics 15.

With respect to their reflection surfaces, the mirrors M2 and B3 as well as the mirrors M4 and B3 are arranged back to back.

Optical data of the illumination optics 9 are hereinafter listed in a table. The columns "Radius x" and "Radius y" of this table each show the radii of curvature of the mirrors B1 to B3 in the xz- and yz-planes. These radii of curvature are only different for the mirror B3 which is a toric mirror having a larger radius of curvature in the yz-plane than in the xz-plane.

The third column (conical constant) of this table describes the conical constant K for the surface description of the mirror B1 according to the following aspheric equation for the sagittal height z (h):

$$z(h) = \frac{ch^2}{1 + SQRT\{1 - (1+K)c^2h^2\}} + Ah^4 + Bh^6 + Ch^8 + Dh^{10} + Eh^{12}$$

In this equation, h is the distance from the optical axis, in other words the normal 18, of the imaging optics 1. In other words, $h^2 = x^2 + y^2$. c is substituted in the equation by the reciprocal of "radius".

The fourth column (thickness) of the table describes the distance of the object plane 4 from the surface which is in each case arranged downstream in the z-direction. If the following numbers refer to a length, the unit mm shall be used unless specified otherwise.

The value "y-decenter" in this table describes the displacement of the mirror surface in the y-direction. The value "x-inclination" describes an inclination of the respective mirror surface about the x-axis.

| Surface | Radius x | Radius y | Conical Constant | Thickness | y-decenter | x-inclination | Mode of operation |
|---|---|---|---|---|---|---|---|
| Object plane | 0,000 | 0,000 | 0,000 | 192,770 | 0,000 | 0,000 | |
| Mirror B3 | −167,170 | −167,507 | 0,000 | −122,770 | −0,013 | −5,286 | REFL |
| Mirror B2 | −55,162 | −55,162 | 0,000 | 58,356 | 0,004 | −18,460 | REFL |
| Setting stop | 0,000 | 0,000 | 0,000 | 320,670 | 47,687 | 0,000 | |
| Intermediate focal plane | 0,000 | 0,000 | 0,000 | 320,000 | 0,000 | 0,000 | |
| Mirror B1 (Collektor) | −386,810 | −386,810 | −0,309 | −357,245 | 204,913 | 3,278 | REFL |
| Light source | 0,000 | 0,000 | 0,000 | 0,000 | 0,000 | 10,450 | |

Optical data of the imaging optics 15 are hereinafter listed in two further tables. The column "Radius" in the first table again contains the respective radii of curvature of the mirrors M1 to M4. The third column (thickness) again describes the distance of the object plane 4 from the surface which is in each case arranged downstream in the z-direction. The following second table contains the asphericity coefficients A to E for the surface description of the mirror M1 corresponding to the above aspheric equation.

| Surface | Radius | Thickness | Mode of operation |
|---|---|---|---|
| Objekt plane | INFINITE | 156,300 | |
| Aperture Stop | INFINITE | 742,214 | |
| M1 | −747,499 | −651,868 | REFL |
| M2 | 23,479 | 703,354 | REFL |
| M3 | 100,000 | −673,354 | REFL |
| M4 | 1708,075 | 723,354 | REFL |
| Image plane | INFINITE | 0,000 | |

| Surface | K | A | B |
|---|---|---|---|
| M1 | 0.000000E+00 | 9.550618E−12 | 1.671210E−17 |
| Surface | C | D | E |
| M1 | 2.972109E−23 | 2.740807E−29 | 1.533462E−34 |

With respect to the surface description of the illumination optics 9, a coordinate origin is displaced by 50 μm in the positive y-direction relative to the optical axis (x=0, y=0) of the imaging optics 15.

The invention claimed is:

1. Illumination optics for a metrology system for examining an object arranged in an object field using EUV illumination light, the illumination optics comprising:
   a beam path between an EUV light source and the object field;
   a collector mirror which is arrangeable in the beam path directly downstream of the EUV light source; and
   less than three additional illumination mirrors arranged in the beam path between the collector mirror and the object field, with an intermediate focal plane being arranged in the beam path between the collector mirror and the first additional illumination mirror.

2. The illumination optics according to claim 1, wherein exactly two additional illumination mirrors are provided downstream of the collector mirror.

3. The illumination optics according to claim 2, wherein the two additional illumination mirrors are NI mirrors.

4. The illumination optics according to claim 1, wherein an illumination chief ray angle ($\alpha$) is at least 6°.

5. The illumination optics according to claim 1, wherein a numerical aperture on the object side is at least 0.0625.

6. The illumination optics according to claim 1, comprising a setting stop in the beam path between the intermediate focal plane and the first additional illumination mirror downstream of the collector mirror.

7. The illumination optics according to claim 1, comprising an arrangement of bundle-guiding components such that a plane, which is provided for arranging the EUV light source, is imaged into an object plane in which the object field is arranged.

8. A metrology system for examining an object arranged in an object field using EUV illumination light, the metrology system comprising:
    an illumination optics according to claim 1; and
    a magnifying imaging optics for imaging the object field into an image field in an image plane.

9. The metrology system according to claim 8, wherein the imaging optics comprises exactly four mirrors.

10. The illumination optics according to claim 2, wherein an illumination chief ray angle ($\alpha$) is at least 6°.

11. The illumination optics according to claim 3, wherein an illumination chief ray angle ($\alpha$) is at least 6°.

12. The illumination optics according to claim 2, wherein a numerical aperture on the object side is at least 0.0625.

13. The illumination optics according to claim 3, wherein a numerical aperture on the object side is at least 0.0625.

14. The illumination optics according to claim 4, wherein a numerical aperture on the object side is at least 0.0625.

15. The illumination optics according to claim 2, comprising a setting stop in the beam path between the intermediate focal plane and the first additional illumination mirror downstream of the collector mirror.

16. The illumination optics according to claim 3, comprising a setting stop in the beam path between the intermediate focal plane and the first additional illumination mirror downstream of the collector mirror.

17. The illumination optics according to claim 4, comprising a setting stop in the beam path between the intermediate focal plane and the first additional illumination mirror downstream of the collector mirror.

18. The illumination optics according to claim 5, comprising a setting stop in the beam path between the intermediate focal plane and the first additional illumination mirror downstream of the collector mirror.

19. The illumination optics according to claim 2, comprising an arrangement of bundle-guiding components such that a plane, which is provided for arranging the EUV light source, is imaged into an object plane in which the object field is arranged.

20. The illumination optics according to claim 3, comprising an arrangement of bundle-guiding components such that a plane, which is provided for arranging the EUV light source, is imaged into an object plane in which the object field is arranged.

21. Illumination optics for a metrology system for examining an object arranged in an object field using EUV illumination light, the illumination optics comprising:
    a beam path between an EUV light source and the object field;
    a collector mirror which is arrangeable in the beam path directly downstream of the EUV light source;
    less than three additional illumination mirrors arranged in the beam path between the collector mirror and the object field, with an intermediate focal plane being arranged in the beam path between the collector mirror and the first additional illumination mirror; and
    a setting stop in the beam path between the intermediate focal plane and the first additional illumination mirror downstream of the collector mirror.

* * * * *

UNITED STATES PATENT AND TRADEMARK OFFICE
CERTIFICATE OF CORRECTION

PATENT NO. : 9,110,225 B2  
APPLICATION NO. : 13/698552  
DATED : August 18, 2015  
INVENTOR(S) : Hans-Jürgen Mann et al.

It is certified that error appears in the above-identified patent and that said Letters Patent is hereby corrected as shown below:

IN THE SPECIFICATION

Column 3

Lines 39-40, delete "lighographic" and insert -- lithographic --

Column 6

Line 38 (Approx.), delete "objekt" and insert -- object --

Signed and Sealed this  
Fifth Day of January, 2016

Michelle K. Lee  
*Director of the United States Patent and Trademark Office*